(12) United States Patent
Zhou et al.

(10) Patent No.: US 9,914,337 B2
(45) Date of Patent: Mar. 13, 2018

(54) VEHICLE WITH ADSORPTION-BASED THERMAL BATTERY

(71) Applicant: Toyota Motor Engineering & Manufacturing North America, Inc., Erlanger, KY (US)

(72) Inventors: Feng Zhou, Ann Arbor, MI (US); Ercan Mehmet Dede, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 328 days.

(21) Appl. No.: 14/639,248

(22) Filed: Mar. 5, 2015

(65) Prior Publication Data

US 2016/0257180 A1 Sep. 8, 2016

(51) Int. Cl.
*B60H 1/00* (2006.01)
*H01L 35/30* (2006.01)
*F01N 5/02* (2006.01)

(52) U.S. Cl.
CPC ..... *B60H 1/00492* (2013.01); *B60H 1/00878* (2013.01); *F01N 5/025* (2013.01); *H01L 35/30* (2013.01)

(58) Field of Classification Search
CPC . B60H 1/00492; B60H 1/00878; F01N 5/025; H01L 35/30
See application file for complete search history.

(56) References Cited

U.S. PATENT DOCUMENTS

| | | | | | |
|---|---|---|---|---|---|
| 1,833,901 | A | * | 12/1931 | Hull | F25B 17/083 62/144 |
| 4,183,227 | A | * | 1/1980 | Bouvin | F25B 17/08 62/480 |
| 4,610,148 | A | * | 9/1986 | Shelton | F25B 17/083 62/106 |
| 4,765,395 | A | * | 8/1988 | Paeye | F25B 17/083 165/104.12 |

(Continued)

OTHER PUBLICATIONS

Narayanan et al.; "Design and Optimization of High Performance Adsorption-Based Thermal Battery"; Proceedings of the ASME 2013 Heat Transfer Summer Conference; Jul. 14, 2013; in 10 pages; Minneapolis, MN, USA.

(Continued)

*Primary Examiner* — Travis Ruby
(74) *Attorney, Agent, or Firm* — Christopher G. Darrow; Darrow Mustafa PC

(57) ABSTRACT

Systems and methods are provided for the continuous operation of an air conditioning unit or climate control system in a vehicle. The system may include a power generating unit, such as an engine or a fuel cell stack, and an exhaust loop in fluid communication with the power generating unit. First and second adsorption-based thermal batteries are provided in thermal communication with the exhaust loop. The vehicle may be configured to simultaneously operate in both an air conditioning operational mode powered by the first thermal battery, and a charging operational mode that regenerates the second thermal battery. A thermoelectric generator may also be provided such that the system is entirely self-powered, reducing or eliminating a need for supplemental, i.e. plug-in, charging.

10 Claims, 5 Drawing Sheets

(56) References Cited

U.S. PATENT DOCUMENTS

| | | | | |
|---|---|---|---|---|
| 4,881,376 | A | * | 11/1989 | Yonezawa ............. F25B 17/083 62/106 |
| 5,445,217 | A | * | 8/1995 | Castaing ................ F25B 17/08 165/104.12 |
| 5,505,059 | A | * | 4/1996 | Sanborn ................ F25B 17/083 62/324.4 |
| 5,729,988 | A | * | 3/1998 | Tchernev ............... F25B 17/08 62/106 |
| 5,823,003 | A | * | 10/1998 | Rosser, Jr. ............. C09K 5/047 62/105 |
| 8,997,505 | B2 | * | 4/2015 | Zhong ................. B60H 1/3201 62/106 |
| 2011/0005267 | A1 | * | 1/2011 | Lambert ................. B60H 1/32 62/476 |
| 2011/0167842 | A1 | * | 7/2011 | Paulussen .............. F25B 17/00 62/79 |
| 2012/0000220 | A1 | | 1/2012 | Altay |
| 2013/0192281 | A1 | | 8/2013 | Nam et al. |
| 2014/0157815 | A1 | | 6/2014 | Mckay et al. |
| 2014/0374058 | A1 | | 12/2014 | Greiner et al. |

OTHER PUBLICATIONS

Ashley, Steven; "Adsorption-based thermal batteries could help boost EV range by 40%"; AEI-Online.org; Oct. 1, 2013; in 8 pages.

\* cited by examiner

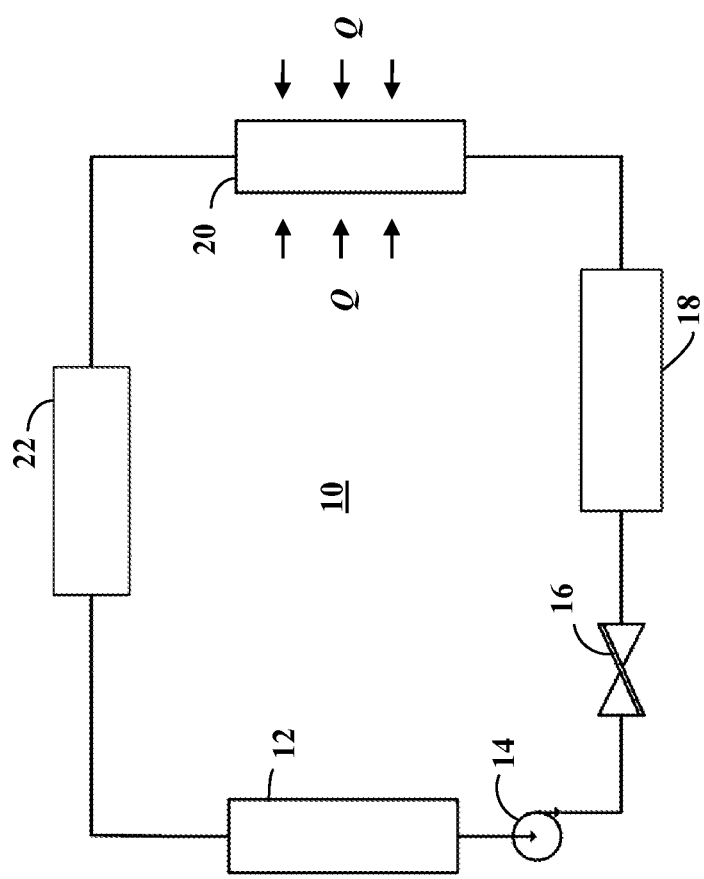

VEHICLE WITH ADSORPTION-BASED THERMAL BATTERY

TECHNICAL FIELD

The present disclosure generally relates to energy management for hybrid electric vehicles or fuel cell powered vehicles and, more particularly, to systems and methods for recapturing energy and improving the means for recharging thermal batteries.

BACKGROUND

The background description provided herein is for the purpose of generally presenting the context of the disclosure. Work of the presently named inventors, to the extent it may be described in this background section, as well as aspects of the description that may not otherwise qualify as prior art at the time of filing, are neither expressly nor impliedly admitted as prior art against the present technology.

Various climate systems for electric and hybrid vehicles may be inefficient or may place a significant drain on the main vehicle battery. Supplemental adsorption-based thermal batteries have recently been developed that are capable of providing both heating and cooling of passenger compartments with minimal use of the main vehicle battery. The capacity of thermal batteries may be limited, at least in part, based on the size of an adsorbent bed. Thus, it may not be possible to operate a vehicle having a single thermal battery for great distances or in extreme climates. In order to "recharge" or regenerate a thermal battery, the absorbent bed component of a thermal battery may need to be heated to a temperature of about 200° C. in order to remove operating fluid, typically water, from the adsorbent medium. Currently, the regeneration process is typically accomplished while concurrently recharging the main vehicle battery, such as an electrochemical battery pack, using resistance heaters during plug-in charging.

Accordingly, it would be desirable to provide a thermal energy management system that is capable of providing an enhanced range and higher efficiency, or driving distance per unit energy. For example, it would be desirable to have a system that can provide adequate and continuous climate control during increasingly longer drive periods resulting from improved vehicle ranges.

SUMMARY

This section provides a general summary of the disclosure, and is not a comprehensive disclosure of its full scope or all of its features.

In various aspects, the present teachings provide a system for the continuous operation of an air conditioning unit in a vehicle, such as a hybrid electric vehicle or a fuel cell powered vehicle. The system may include an appropriate power generating unit, for example, an engine or a fuel cell stack, and an exhaust loop in fluid communication with the power generating unit. First and second adsorption-based thermal batteries may be provided in thermal communication with the exhaust loop. The vehicle may be configured to alternate in a continuous manner between two operational approaches. The first approach may include simultaneously operating in both an air conditioning operational mode powered by the first thermal battery, and a charging operational mode that regenerates the second thermal battery. The second approach may include simultaneously operating in both an air conditioning operational mode powered by the second thermal battery, and a charging operational mode that regenerates the first thermal battery.

In other aspects, the present teachings provide a method for managing a zero-energy consumption operation for a vehicle. The method may include providing an exhaust loop in fluid communication with a power generating unit, and in thermal communication with each of a first adsorption-based thermal battery, a second adsorption-based thermal battery, and a thermoelectric generator. A climate control system may be powered by the first thermal battery. An adsorbent medium of the second thermal battery may be concurrently recharging using waste heat from the exhaust loop. In various aspects, the thermoelectric generator may direct electricity for use in recharging an electrochemical vehicle battery or for powering at least one of a thermal battery pump, a coolant pump, and a fan unit.

In still other aspects, the present teachings provide a method for a continuous operation of a climate control system in a hybrid electric vehicle. The method may include providing an exhaust loop in fluid communication with an engine, and in thermal communication with each of a first group of adsorption-based thermal batteries, a second group of adsorption-based thermal batteries, and at least one thermoelectric generator. The method may include alternating the continuous operation of the climate control system powered by one of the first and second groups of thermal batteries. Concurrently with the operation of the climate control system, the method may further include recharging an adsorbent medium of the other one of the first and second groups of thermal batteries using waste heat from the exhaust loop.

Further areas of applicability and various methods of enhancing energy management technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein:

FIGS. 1A-1C are simplified flowcharts illustrating a single-cell thermal battery in use with a vehicle during each of: a summer, or cooling mode (FIG. 1A), a winter or heating mode (FIG. 1B), and a regeneration, or charging mode (FIG. 1C);

Figure 1B:
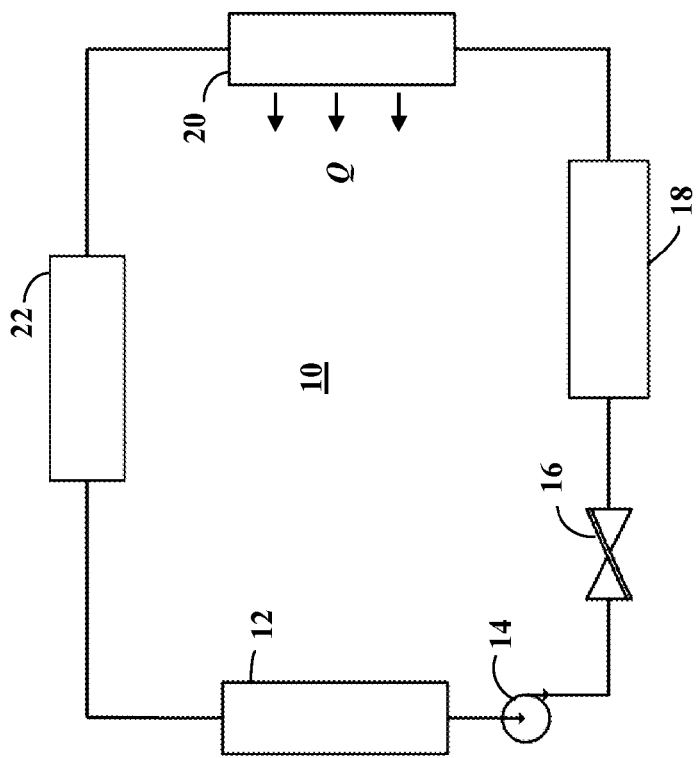

It should be noted that the figures set forth herein are intended to exemplify the general characteristics of materials, methods, and devices among those of the present technology, for the purpose of the description of certain aspects. These figures may not precisely reflect the characteristics of any given aspect, and are not necessarily intended to define or limit specific embodiments within the scope of this technology. Further, certain aspects may incorporate features from a combination of figures.

DETAILED DESCRIPTION

The following description is merely illustrative in nature and is in no way intended to limit the disclosure, its application, or uses. As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for general organization of topics within the present disclosure, and are not intended to limit the disclosure of the technology or any aspect thereof. The recitation of multiple embodiments having stated features is not intended to exclude other embodiments having additional features, or other embodiments incorporating different combinations of the stated features.

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect, or various aspects means that a particular feature, structure, or characteristic described in connection with an embodiment or particular system is included in at least one embodiment or aspect. The appearances of the phrase "in one aspect" (or variations thereof) are not necessarily referring to the same aspect or embodiment. It should be also understood that the various method steps discussed herein do not have to be carried out in the same order as depicted, and not each method step is required in each aspect or embodiment.

The present technology generally relates to systems and methods for recapturing energy and reducing the need for recharging thermal batteries in a vehicle using external means. In particular, the present technology contemplates the use of a twin-cell thermal battery system that includes two separate adsorbent beds. The use of two or more thermal batteries, and thus, two or more respective adsorbent beds, enables systems and methods to recapture energy that may otherwise be lost as waste heat for use in heating and/or cooling various compartments of a vehicle and electrical energy for vehicle systems. In various aspects, a first adsorbent bed from a first thermal battery may be configured to support the operation of a climate control system, such as an air conditioning unit, while a second adsorbent bed from a second thermal battery may be configured to concurrently absorb heat from an engine system and recharge. By recapturing energy, systems and methods of the present technology improve the efficiencies of vehicles, for example in driving distance per unit energy. In various aspects, use of the present technology may reduce and/or eliminate a need for plug-in charging for thermal battery usage.

As used herein, the term "vehicle" should be construed having a broad meaning, and should include all types of vehicles, with non-limiting examples including a passenger car, truck, motorcycle, off-road vehicle, bus, boat, airplane, helicopter, lawn mower, recreational vehicle, amusement park vehicle, farm vehicle, construction vehicle, tram, golf cart, train, or trolley, etc.

In various non-limiting aspects, the present technology may be applicable to hybrid electric vehicles typically having a hydrocarbon/fossil-fuel (or equivalent) based internal combustion engine as a power generating unit. In other aspects, the present technology may be applicable to fuel cell powered vehicles, for example, vehicles having at least one fuel cell or fuel cell stack as a power generating unit to drive a motor. Internal combustion engines may produce various heated exhaust gases, while fuel cell stacks may produce a heated exhaust gas generally including water vapor.

Figure 1A:
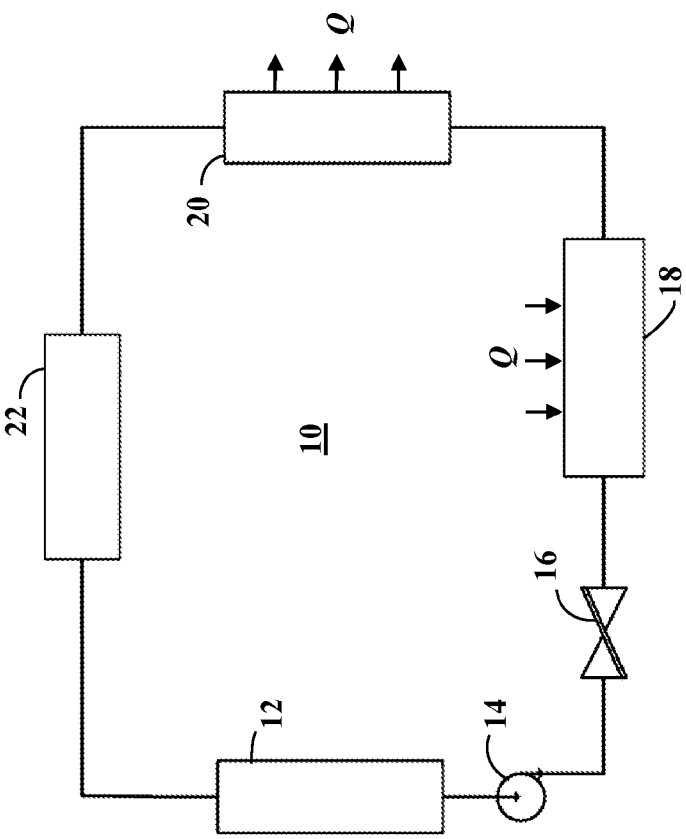

FIGS. 1A, 1B, and 1C are exemplary, simplified flow charts illustrating the use of a single-cell thermal battery in a vehicle. FIG. 1A illustrates a summer mode, or cooling mode; FIG. 1B illustrates a winter mode, or heat mode; and FIG. 1C illustrates a regeneration mode, or recharging mode. In each of FIGS. 1A-1C, an interior cabin of an electric vehicle is generally depicted by reference number 10. A suitable reservoir 12 stores an appropriate refrigerant fluid that is selectively provided through an appropriate pump 14 and expansive valve mechanism 16 to an evaporator unit 18, where the refrigerant fluid vaporizes. The subsequent transport and adsorption of vapor into the adsorption bed 20 releases heat that is typically dissipated using a heat exchanger. Arrows indicated by "Q" indicate a heat transfer direction.

In the summer mode, FIG. 1A, heat from the adsorbent bed 20 may be directed to the ambient environment, and air may be cooled via the evaporator and directed into the cabin 10. In the winter mode, FIG. 1B, heat from the adsorbent bed 20 may be directed to the cabin 10. In both summer and winter modes, material in the adsorbent bed 20 eventually becomes saturated with refrigerant fluid. The adsorption bed 20 regeneration is illustrated in FIG. 1C, where heat from an external thermal source, typically a resistive heater powered by a plug-in unit, is directed to the adsorption bed 20, and refrigerant vapor desorbed from the adsorbent bed 20 is transferred to a condenser 22, where it is condensed and subsequently collected back into the reservoir 12 for subsequent cycles of operation.

Figure 2:
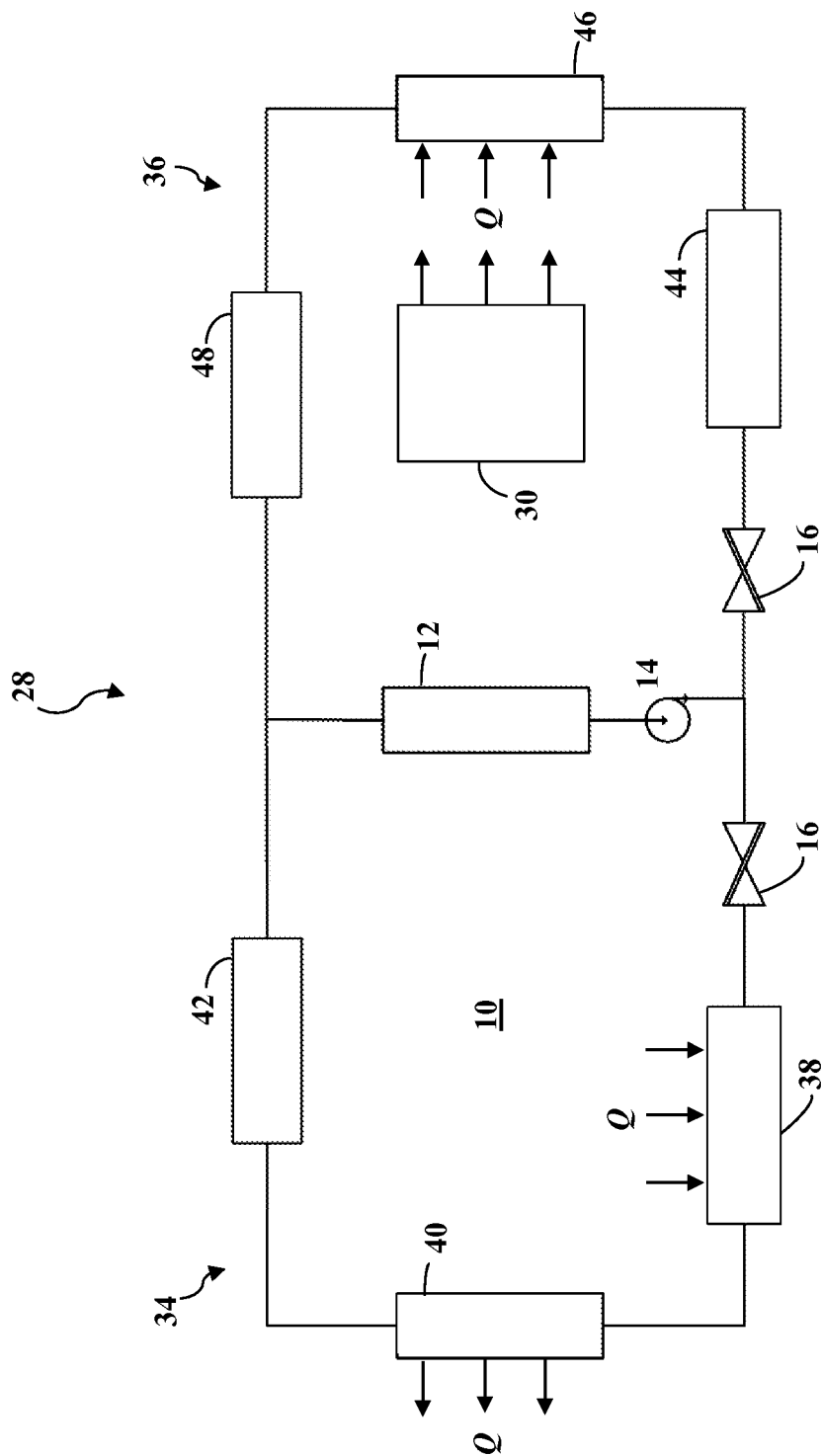
FIG. 2 is an exemplary, simplified flowchart illustrating a twin-cell thermal battery configuration that may be used in an accordance with various aspects of the present technology.
Figure 3:
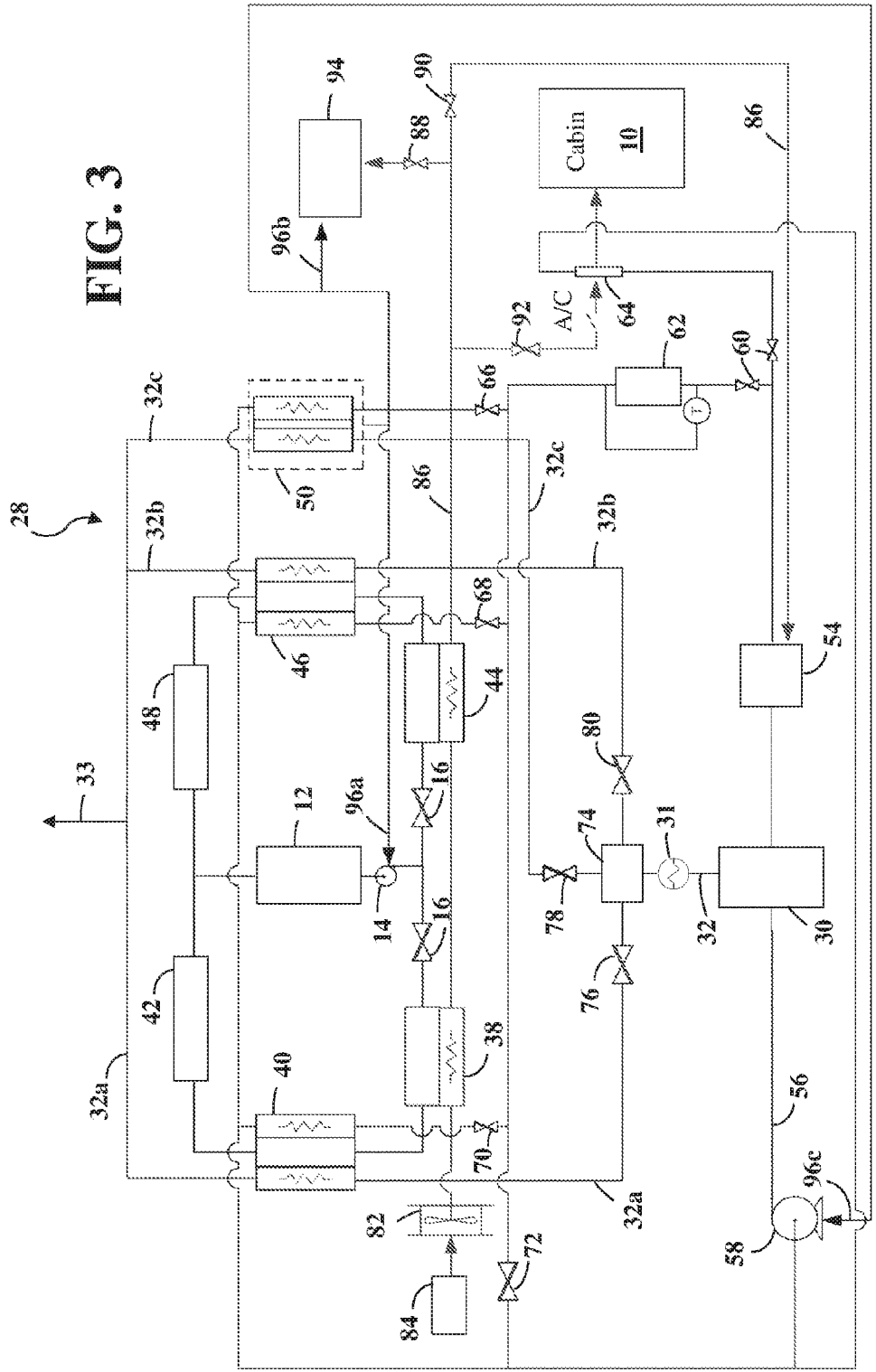
FIG. 3 is a schematic diagram illustrating various details of a system for a zero-sum thermal energy consumption design for a vehicle according to various aspects of the present technology.

FIG. 2 is an exemplary, simplified flowchart illustrating a twin-cell thermal battery configuration that may be used in an accordance with various aspects of the present technology. FIG. 3 is a schematic diagram illustrating various details of a system for a zero-sum thermal energy consumption design for a vehicle. It should be understood that the various features as shown in FIGS. 2 and 3 are non-limiting examples, and do not necessarily include every component of the present technology.

As will be described in more detail below, FIG. 2 generally depicts a system for the continuous operation of climate control system, such as an air conditioning unit, in a cabin 10 of a vehicle 28. The system includes a power generating unit 30, such as an internal combustion engine or a fuel cell stack, and an exhaust loop 32 (FIG. 3) in fluid communication with the power generating unit 30. First and second adsorption-based thermal batteries 34, 36 are provided in thermal communication with the exhaust loop 32. The vehicle 28 may be configured to alternate in a continuous manner between two operational approaches. The first approach, which is shown in FIG. 2, includes simultaneously operating in both an air conditioning operational mode powered by the first thermal battery 34, and a charging operational mode that regenerates the second thermal battery 36. The second approach is generally a reversal of the first approach, and includes simultaneously operating in both an air conditioning operational mode powered by the second thermal battery 36, and a charging operational mode that regenerates the first thermal battery 34.

By way of example, the first thermal battery 34 may include a first evaporator 38, a first adsorbent bed 40, and a first condenser unit 42. The second thermal battery 36 may include a second evaporator 44, a second adsorbent bed 46, and a second condenser unit 48. The first and second thermal batteries 34, 36 may share a common refrigerant fluid reservoir 12, pump 14, and expansive valve mechanisms 16, which may be configured as desired.

FIG. 3 provides additional details of the zero-sum thermal energy consumption design for a vehicle 28 according to one non-limiting aspect. As mentioned above, a power generating unit 30 is in fluid communication with an exhaust loop 32 that ultimately includes at least one outlet 33, such as a tailpipe.

In addition to an engine and/or fuel cell stack 30, the vehicle 28 may include a suitable power control unit (PCU) 54. In various aspects, the system may include a thermoelectric generator 50 in thermal communication with the exhaust loop 32. As is known in the art, a thermoelectric generator 50 is a device that converts heat (temperature differences) directly into electrical energy, using a form of thermoelectric effect. As non-limiting examples, it is envisioned that electricity generated by the thermoelectric generator 50 may be used to power the thermal battery fluid pump 14 via a first connection 96*a*, recharge a vehicle battery pack 94 via a second connection 96*b*, and power a coolant pump 58 via a third connection 96*c*. It is also envisioned that the generated electricity may power one or more fan units that work with the climate control system.

A coolant loop 56 containing an appropriate coolant fluid may be provided in thermal communication with the first adsorbent bed 40 of the first thermal battery 34, the second adsorbent bed 46 of the second thermal battery 36, and the thermoelectric generator 50. In various aspects, a coolant pump 58 is configured to pump coolant fluid to the power generating unit 30 and the PCU 54. The coolant fluid may then be directed by appropriate valves 60 and a thermostat "T" to a radiator 62, a heater coil 64, and/or further valves 66, 68, 70, 72 to selectively allow coolant fluid to pass through to the thermoelectric generator 50, the second adsorbent bed 46, the first adsorbent bed 40, and the coolant pump 58, respectively.

In various aspects, at least one controller 74 may be provided to control various devices, systems, and methods according to the present teachings. The controller 74 may include software and appropriate algorithms that may cooperate with one or more other controllers or computer systems of the vehicle, which are not specifically shown herein for purposes of simplicity. Thus, it should be understood that the controller 74 may be in direct or indirect communication with various components of the system, even if it is not specifically shown. Certain methods may use computer program products accessible from a computer-usable or computer-readable medium providing program or software code that can be used with a computer, computing device, server, remote server, or any other type of execution system. For purposes of this description, and as known to those of ordinary skill in the art, a computer-usable or computer-readable medium can include any device or apparatus that can contain, store, communicate, propagate, or transport the program for use by or in connection with an instruction execution system, apparatus, or device.

In one example, the controller 74 may be configured to operate and separately direct a flow of heated exhaust through various valves 76, 78, 80 configured to direct a flow of the exhaust through the exhaust loop 32. For example, exhaust may be diverted from the power generating unit 30 and split into a plurality of discrete regions 32*a*, 32*b*, and 32*c*, respectively directed to each of the first thermal battery adsorption bed 40, the second thermal battery adsorption bed 46, and the thermoelectric generator 50. Depending on the desired temperature for use with the thermal batteries and thermoelectric generator, it may be necessary to pass the exhaust gas through one or more intermediate heat exchangers 31 in order to lower a temperature of the exhaust gas, as desired.

In various aspects, the controller 74 may be configured to monitor a capacity of each adsorbent bed 40, 46 and determine when the adsorbent beds 40, 46 have reached an adsorption capacity such that they can no longer fully function in an adsorption mode. When such a capacity has been detected, the controller 74 may be configured to reverse the operational modes of the first and second thermal batteries 34, 36. In this regard, the climate control system may be powered by the second thermal battery 36, while the charging operational mode regenerates the adsorption bed 40 of the first thermal battery 34.

With continued reference to FIG. 3, when operating in the air conditioning mode, an air intake fan 82 or other appropriate device may direct a source of outside air 84 through one or both of the evaporator units 38, 44, generating a cold air stream 86. The cold air stream 86 can be diverted, using various valves 88, 90, 92, for use in cooling a vehicle battery pack 94, cooling the PCU 54, cooling the vehicle cabin 10.

The present teachings additionally provide various methods for managing a zero-energy consumption operation for a vehicle, and for the continuous operation of a climate control system in a vehicle. As described above, various methods include providing an exhaust loop 32 in fluid communication with a power generating unit 30, and in thermal communication with each of a first adsorption-based thermal battery 34, a second adsorption-based thermal battery 36, and a thermoelectric generator 50.

In one aspect, a controller engages the climate control system that may initially be powered by the first thermal battery 34. An adsorbent medium disposed in an adsorbent bed 46 of the second thermal battery 36 may be concurrently recharging using waste heat from one region 32*b* of the exhaust loop 32. As referenced herein, the "recharging" of an adsorbent material refers to the regeneration or heating of the absorbent material such that the refrigerant fluid desorbs as a vapor that is subsequently condensed in one of the condensers 42, 48 and stored in the reservoir 12. Typically, the adsorbent material is heated to a temperature of about 200° C. It should be understood that the temperature may be higher or lower, depending on the type of adsorption material. It is envisioned that various conventional adsorbent materials can be used with the present teachings, including zeolite, biporous zeolite, metal organic frameworks (MOFs), 13X, MCM-41, MFI, VPI-5, ZIF, graphite flakes, carbon nanotubes, or any combination of these adsorbent materials, and the like. Similarly, various conventional refrigerant fluids may be used, including water and a fluid comprising water.

With reference to FIGS. 2-3, operating the climate control system powered by the first thermal battery 34 includes selectively permitting a refrigerant fluid to pass from a reservoir 12 through a first evaporator unit 38. The method includes collecting the refrigerant fluid in an adsorbent medium of the first adsorbent bed 40 of the thermal battery 34, thereby cooling a temperature of the first evaporator 38. Ambient or outside air may then be directed over the first evaporator 38, creating a cold air stream 86 for use with the air conditioning system, where it is directed into a cabin 10 of the vehicle. As described above, the cold air stream may additionally or alternatively be directed to cool the vehicle battery pack 94, or directed to cool the PCU 54.

In various aspects, recharging the adsorbent medium of the adsorbent bed 46 of the second thermal battery 36 includes selectively directing a flow of exhaust gas through a region 32b of the exhaust loop in thermal communication with the adsorbent medium of the second adsorbent bed 46, thereby heating the adsorbent medium and causing desorption of the refrigerant fluid. The method includes passing the refrigerant fluid through a condenser 48 and back into the reservoir 12.

During the operation of the climate control system, the methods of the present teachings may include detecting when an adsorption capacity of the first thermal battery 34 reaches a predetermined level. For example, when the adsorbent material in the first adsorbent bed 40 is no longer fully capable of adsorbing refrigerant fluid. In various aspects, this may include monitoring a pressure, temperature, or other relevant parameter of the adsorbent bed. The controller 74 may be configured to stop the operation of the climate control system as powered by the first thermal battery 34, and subsequently commence operation of the climate control system powered by the second thermal battery 36. In this regard, the method may include concurrently recharging an adsorbent medium of the first battery 34 using waste heat from an adjacent region 32a of the exhaust loop.

Operating the climate control system powered by the second thermal battery 36 may include selectively permitting the refrigerant fluid to pass from the reservoir 12 through the second evaporator 44 and collecting the refrigerant fluid in an adsorbent medium of the adsorbent bed 46 of the second thermal battery 36, thereby cooling a temperature of the second evaporator 44. Ambient or outside air may then be directed over the second evaporator 44, creating a cold air stream 86 for use with the air conditioning system, where it is directed into a cabin 10 of the vehicle, or additionally or alternatively directed to cool the vehicle battery pack 94, the PCU 54.

As discussed above, the methods of the present teachings may also include directing the flow of exhaust gas through one or more intermediate heat exchangers prior to directing the flow of exhaust gas to one of the first thermal battery 34, the second thermal battery 36, and the thermoelectric generator 50. In various aspects, the thermoelectric generator 50 may generate and direct electricity for use in recharging an electrochemical vehicle battery pack 94, or for powering at least one of the thermal battery pump 14, the coolant pump 58, and/or a fan unit part of the climate control system. It is envisioned that in instances where the methods include directing electricity generated by the thermoelectric generator to recharge an electrochemical vehicle battery, this may reduce or eliminate a need for supplemental, or plug-in type charging.

Figure 4:
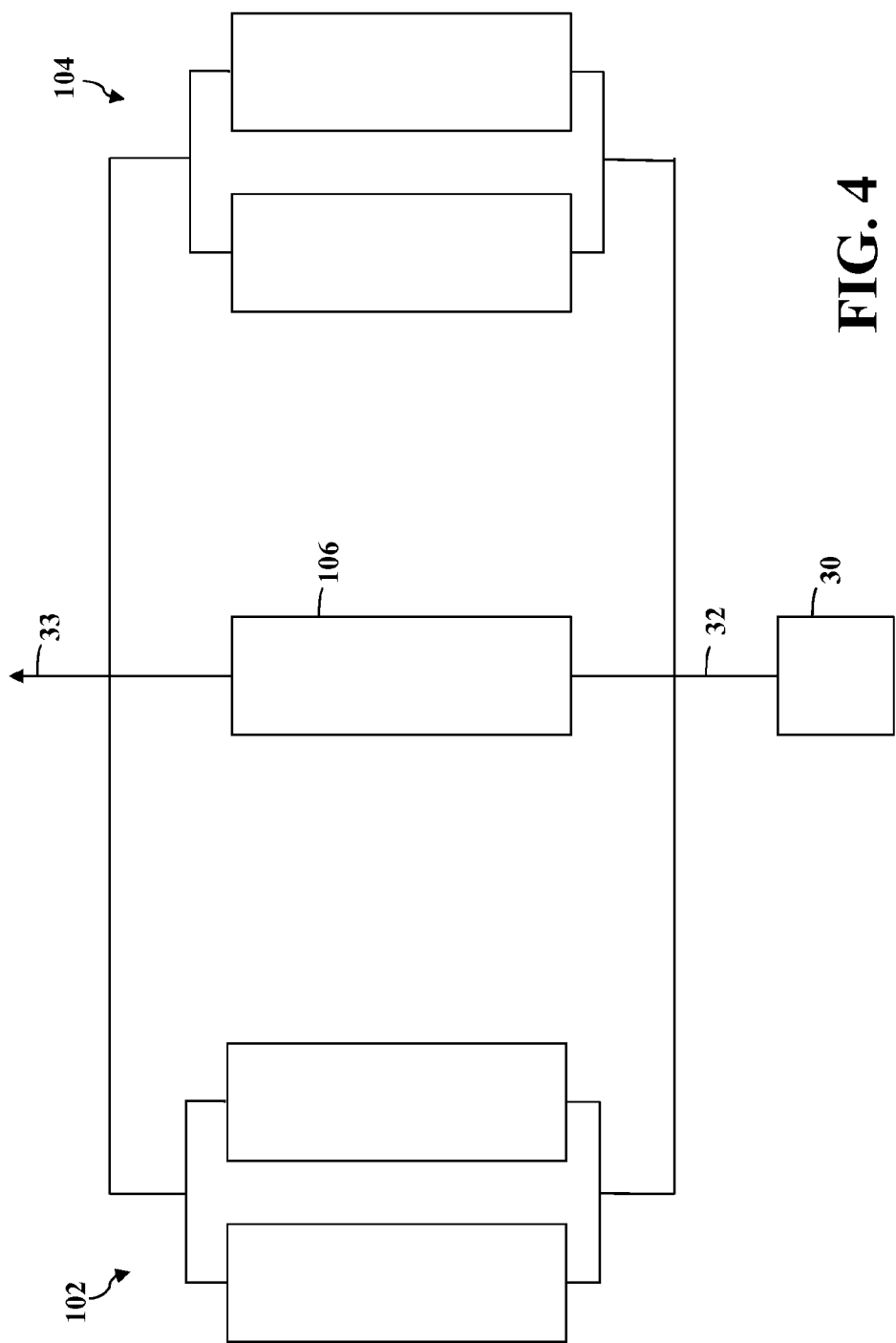
FIG. 4 is a schematic diagram illustrating one aspect for the continuous operation of a climate control system in a vehicle using groups of thermal batteries.

In still other aspects, the present teachings provide a method for the continuous operation of a climate control system in a vehicle using groups of thermal batteries, as shown in FIG. 4. FIG. 4 is a simplified flow chart, only depicting two groups of two thermal batteries. It should be understood that other configurations are also envisioned, including more than two groups, and groups having more than two thermal batteries operating in series or parallel with one another. The methods generally operate substantially similar to those described above, except for the presence of additional thermal batteries. Thus, the method may include providing an exhaust loop 32 in fluid communication with a power generating unit 30, and in thermal communication with each of a first group of adsorption-based thermal batteries 102, a second group of adsorption-based thermal batteries 104, and at least one thermoelectric generator 106. Although not shown for simplicity, each thermal battery may include a separate evaporator, adsorbent bed, and condenser. Each battery and the thermoelectric generator may also be in thermal communication with an appropriate coolant loop. The method may include alternating the continuous operation of the climate control system powered by either one of the first and second groups 102, 104 of thermal batteries. Concurrently with the operation of the climate control system, the method further includes recharging adsorbent mediums of the other one of the first and second groups of thermal batteries, using waste heat from the exhaust loop 32. It is envisioned that the use of groups of batteries may provide yet additional range for a vehicle.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations should not be regarded as a departure from the disclosure, and all such modifications are intended to be included within the scope of the disclosure.

What is claimed is:

1. A method for managing a continuous operation of an air conditioning unit for a vehicle, the method comprising:
providing an exhaust loop in fluid communication with a power generating unit, and in thermal communication with each of: a first adsorption-based thermal battery that includes a first evaporator, a first condenser, and a first adsorbent bed; a second adsorption-based thermal battery that includes a second evaporator, a second condenser, and a second adsorbent bed; and a thermoelectric generator;
operating a climate control system powered by the first thermal battery;
concurrently recharging an adsorbent medium of the second thermal battery using waste heat from the exhaust loop;
monitoring at least one parameter of the first thermal battery to detect when an adsorption capacity of the first adsorbent bed reaches a predetermined level;
using a controller configured to monitor and direct a flow of exhaust gas, reversing operational modes of the first and second thermal batteries, including:
stopping operation of the climate control system powered by the first thermal battery;

commencing operation of the climate control system powered by the second thermal battery; and concurrently recharging an adsorbent medium of the first thermal battery using waste heat from the exhaust loop.

2. The method according to claim 1, wherein operating the climate control system powered by the first thermal battery comprises:

selectively permitting a fluid to pass from a reservoir through the first evaporator;

collecting the fluid in an adsorbent medium of the first thermal battery, thereby cooling a temperature of the first evaporator; and directing air over the first evaporator and into a cabin of the vehicle.

3. The method according to claim 2, wherein recharging the adsorbent medium of the second thermal battery comprises:

selectively directing a flow of exhaust gas through a region of the exhaust loop in thermal communication with the adsorbent medium of the second thermal battery, thereby heating the adsorbent medium and causing desorption of the fluid; and passing the fluid through the first condenser and into the reservoir.

4. The method according to claim 3, wherein operating the climate control system powered by the second thermal battery comprises:

selectively permitting a fluid to pass from a reservoir through the second evaporator and collecting the fluid in an adsorbent medium of the second thermal battery, thereby cooling a temperature of the evaporator; and directing air over the second evaporator and into the cabin of the vehicle.

5. The method according to claim 4, wherein recharging the adsorbent medium of the first thermal battery comprises:

selectively directing a flow of exhaust gas through a region of the exhaust loop in thermal communication with the adsorbent medium, thereby heating the adsorbent medium and causing desorption of the fluid; and passing the fluid through the second condenser and into the reservoir.

6. The method according to claim 1, further providing a controller configured to selectively direct a flow of exhaust gas in the exhaust loop between the first thermal battery, the second thermal battery, and the thermoelectric generator.

7. The method according to claim 6, further comprising directing the flow of exhaust gas through one or more intermediate heat exchangers prior to directing the flow of exhaust gas to one of the first thermal battery, the second thermal battery, and the thermoelectric generator.

8. The method according to claim 1, further comprising directing electricity generated by the thermoelectric generator to recharge an electrochemical vehicle battery, thereby reducing or eliminating a need for supplemental charging.

9. The method according to claim 1, further comprising directing electricity generated by the thermoelectric generator to operate at least one of a thermal battery pump, a coolant pump, and a fan unit of the climate control system.

10. The method according to claim 1, wherein the exhaust loop is provided in fluid communication with a first group of adsorption-based thermal batteries, and a second group of adsorption-based thermal batteries, and the method comprises alternating the continuous operation of the climate control system powered by one of the first and second groups of thermal batteries, while concurrently recharging an adsorbent medium of the other one of the first and second groups of thermal batteries using waste heat from the exhaust loop.

* * * * *